United States Patent
Ho et al.

(10) Patent No.: US 6,951,773 B2
(45) Date of Patent: Oct. 4, 2005

(54) CHIP PACKAGING STRUCTURE AND MANUFACTURING PROCESS THEREOF

(75) Inventors: Kwun-Yo Ho, Taipei Hsien (TW); Moriss Kung, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 287 days.

(21) Appl. No.: 10/249,060

(22) Filed: Mar. 13, 2003

(65) Prior Publication Data

US 2004/0090756 A1 May 13, 2004

(30) Foreign Application Priority Data

Nov. 7, 2002 (TW) ........................................ 91132740 A

(51) Int. Cl.[7] ............................................. H01L 21/44
(52) U.S. Cl. ....................... 438/106; 438/125; 438/122; 438/108
(58) Field of Search ................................ 438/106, 125, 438/122, 108

(56) References Cited

U.S. PATENT DOCUMENTS

| | | | | |
|---|---|---|---|---|
| 5,811,317 A | * | 9/1998 | Maheshwari et al. | ......... 29/827 |
| 5,866,943 A | * | 2/1999 | Mertol | ................. 257/712 |
| 6,046,077 A | * | 4/2000 | Baba | ..................... 438/127 |
| 6,294,831 B1 | * | 9/2001 | Shishido et al. | ............ 257/729 |
| 6,437,240 B2 | * | 8/2002 | Smith | ................... 174/52.2 |
| 6,472,762 B1 | * | 10/2002 | Kutlu | ................... 257/778 |
| 6,501,175 B2 | * | 12/2002 | Yamashita | ............ 257/737 |

* cited by examiner

Primary Examiner—Luan Thai
(74) Attorney, Agent, or Firm—Jiang Chyun IP Office

(57) ABSTRACT

A structure of a chip package and a process thereof are provided. The process of the chip package makes use of the TFT-LCD panel or IC process to increase the circuit layout density for high electrical performance. First, a multi-layer interconnection structure with pads of high layout density and thin fine circuits is formed on a base substrate with a large-area and high co-planarity surface, wherein the base substrate is made of quartz or glass or ceramics. Then, a chip is located on the top surface of the multi-layer interconnection structure by flip-chip or wire-bonding technology. Then, a substrate or a heat sink is attached on the top surface of the multi-layer interconnection structure for being a stiffener and providing mechanical support. Finally, the base substrate is removed and contacts are attached on the bottom surface of the multi-layer interconnection structure.

17 Claims, 6 Drawing Sheets

CHIP PACKAGING STRUCTURE AND MANUFACTURING PROCESS THEREOF

CROSS REFERENCE TO RELATED APPLICATIONS

This application claims the priority benefit of Taiwan application serial no. 91132740, filed Nov. 7, 2002.

BACKGROUND OF INVENTION

1. Field of the Invention

The invention relates generally to a chip packaging structure and a packaging process thereof. More particularly, the invention provides a chip packaging structure and a chip packaging process to increase the circuit layout density for high electrical performance.

2. Description of the Related Art

A flip chip interconnection structure usually consists of mounting a chip on a carrier substrate via a plurality of conductive bumps that electrically and mechanically connect the die pads of the chip to bump pads of the carrier substrate. Such an interconnection structure is particularly suitable for chip packages with a high pin count, and has the advantages of providing smaller surface areas and shorter electrical paths. Presently, two types of flip chip interconnection structures known in the art are a flip chip ball grid array (FC/BGA) package and a flip chip pin grid array (FC/PGA) package.

Referring to FIG. 1, a schematic view illustrates a structure of FC/BGA package known in the art. The FC/BGA package comprises a substrate 10, a chip 130, a plurality of conductive bumps 140, and a plurality of solder balls 150. The substrate 110 has a plurality of bump pads 116a formed on the side of top surface 112, and a plurality of contact pads 116b formed on an opposite bottom surface 114. The conductive bumps 140 electrically connect die pads 136 on the active surface 132 of the chip 130 to the bump pads 116a of the substrate 110. Meanwhile, The solder balls 150 are attached to the ball pads 116b of the substrate for external connection.

An underfill compound 160 is further formed in the gap between the active surface 132 of the chip 130 and the top surface 112 of the substrate 110 to seal and protect the conductive bumps 140 by sharing thermal strains due to a thermal mismatch between the substrate 110 and the chip 130.

As the dimensional size of the chip package is reduced, the surface area of the chip and the pitch between the bonding pads of the chip become increasingly smaller. In other words, the density of the die pads becomes higher. To adequately accommodate the density of the die pads of the chip, the substrate also has to be provided with a high density of bump pads and a finer circuit layout.

The known FC/BGA or FC/PGA package currently uses a substrate made of ceramic or organic based materials. It should be remarked that the organic substrate is more common. Due to a substantial thermal expansion of the organic material, the trace width and trace pitch currently obtainable inside the substrate are limited to be above 25 $\mu$m. Furthermore, due to the nature of its material, a maximal size of the blank (before cutting) of the organic substrate is limited to 610 mm×610 mm. The above technical limitations of the prior art are not satisfactory in view of current demands.

SUMMARY OF INVENTION

An aspect of the invention is therefore to provide a fabrication process of a chip packaging structure that increases the circuit layout density of the multi-layer interconnection structure for higher electrical performance.

Another aspect of the invention is to provide a fabrication process of a chip packaging structure that reduces the production cost.

To accomplish the above and other objectives, a chip packaging structure of the invention comprises a multi-layered interconnection structure, a chip, a stiffener layer, an isolating layer, and a plurality of external contacts. The multi-layered interconnection structure has a top surface and a bottom surface, and internally includes inner electrical circuits. The chip is mounted on the top surface of the multilayered interconnection structure in a manner to be electrically connected to its inner electrical circuits according to either a flip chip or wire-bonding type. The stiffener layer has a cavity, and is attached on the top surface of the multi-layered interconnection structure with the cavity receiving the chip therein. The isolating layer is attached on the bottom surface of the multi-layered interconnection structure, and includes a plurality of openings that respectively expose a plurality of contact pads defined on the bottom surface of the multi-layered interconnection structure. A plurality of external contacts such as solder balls are attached to the contact pads.

According to an embodiment of the invention, the stiffener layer comprises a stiffener substrate and a heat sink. The stiffener substrate includes a hole, and the heat sink is attached on the stiffener substrate in a manner to cover the hole.

According to another embodiment of the invention, the stiffener layer is a heat sink.

In accordance with the above and other objectives, a chip packaging process of the invention comprises the following steps. First, a base substrate is provided, and an isolating layer is formed on the base substrate. Next, a multi-layered interconnection structure is formed on the isolating layer. The multi-layered interconnection structure includes inner electrical circuits that electrically connect to a plurality of contact pads formed on a bottom surface of the multi-layered interconnection structure. A chip then is mounted on the multi-layered interconnection structure in a manner to be electrically connected to its inner circuits according to either a flip chip or wire-bonding type. Next, a stiffener layer with a cavity therein is attached on the multi-layered interconnection structure in a manner that the cavity receives the chip. Then, the base substrate is removed to expose the isolating layer, and a plurality of openings are formed through the isolating layer to expose the contact pads on the bottom surface of the multi-layered interconnection structure. Finally, a plurality of external contacts are formed on the contact pads.

According to a preferred embodiment of the invention, the base substrate is made of quartz or glass or ceramics, and a fabrication process of a thin film transistor-liquid crystal display (TFT-LCD) panel or a fabrication process of an integrated circuit (IC) is used to form the multi-layered interconnection structure over the base substrate. The obtained multi-layered interconnection structure thereby has bump pads and inner circuit layout with a higher density.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
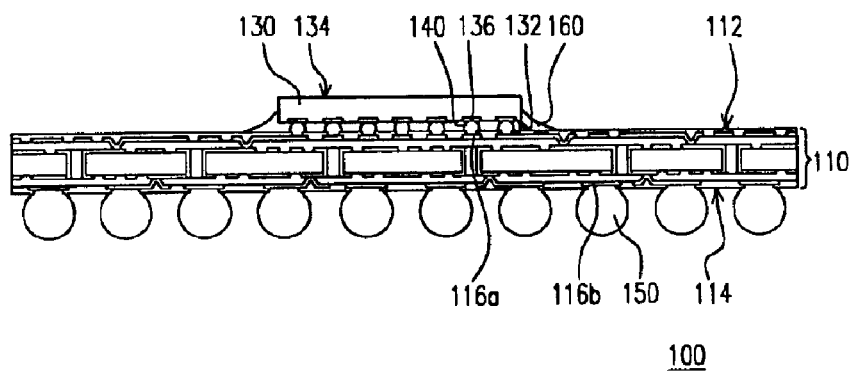
FIG. 1 is a schematic view of a FC/BGA packaging structure known in the prior art.

The following detailed description of the embodiments and examples of the present invention with reference to the accompanying drawings is only illustrative and not limiting. Furthermore, wherever possible in the description, the same reference symbols will refer to similar elements and parts unless otherwise illustrated in the drawings.

Figure 2A:
FIG. 2A through FIG. 2K are schematic views of a chip packaging process according to the first embodiment of the invention.
Figure 2B:

Reference now is made to FIG. 2A through FIG. 2K to describe a chip packaging process according to an embodiment of the invention. In FIG. 2A and FIG. 2B, an isolating layer 204 is formed on a base substrate 202. The base substrate 202 is preferably made of quartz or glass or ceramics, and preferably has a highly planar surface. The isolating layer 204 is made of, for example, polymer, polyester, polyimide (PI), epoxy resin, or benzocyclobutene (BCB). The isolating layer 204 may be adhered on the substrate 202 via film attachment or coating.

Figure 2C:
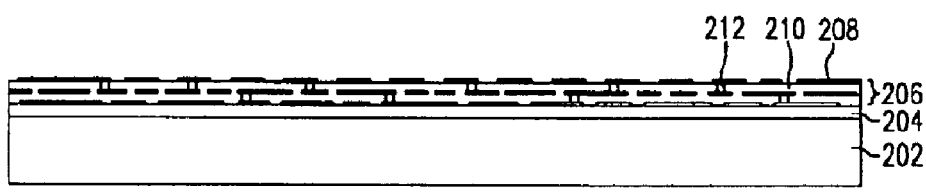

Referring to FIG. 2C, a multi-layered interconnection structure 206 is formed on the isolating layer 204. The multi-layered interconnection structure 206 principally includes a plurality of conductive traces 208, at least a dielectric layer 210, and a plurality of interconnection vias 212 that electrically connect the conductive traces 208 through the dielectric layer 210, thereby forming inner electrical circuits. The conductive traces 208 are made of, for example, copper, aluminum (most commonly used), or other adequate conductive metallic alloys. The dielectric layer 210 is made of, for example, silicon nitride and/or silicon oxide.

According to a preferred embodiment, a processing technique used in the fabrication of thin film transistor/liquid crystal display (TFT-LCD) panels is implemented to form the multi-layered interconnection structure. The obtained width and pitch of both the conductive traces 208 within the structure 206 are between about 1 $\mu$m and 50 $\mu$m and, more particularly, in the order of microns (even smaller than 1 $\mu$m). Therefore, compared with the usually known organic substrate 110 of FIG. 1, the multi-layered interconnection structure 206 provides a higher density of the bump pads and a finer circuit layout. Furthermore, passive components (not shown) may be further incorporated inside the structure 206 (connected to the conductive traces). Passive components such as capacitors or inductors may be formed via, for example, a specific routing design of the conductive traces within the structure 206.

Figure 2D:
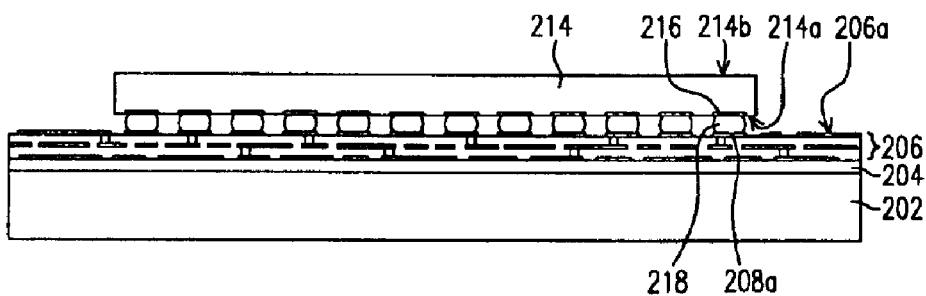
Figure 5:
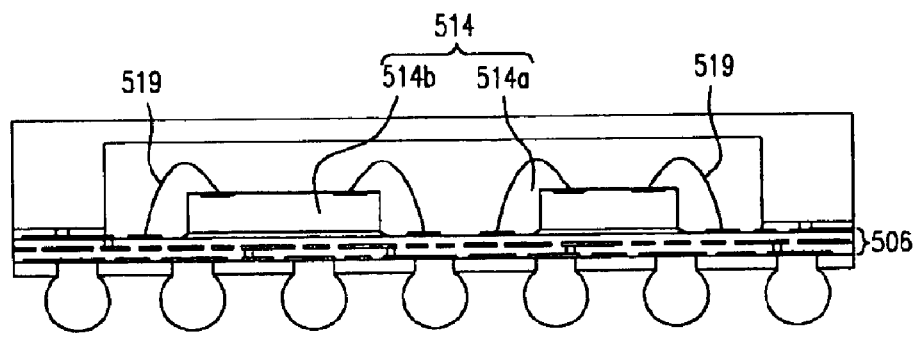
FIG. 5 is a schematic view of a chip packaging structure according to the fourth embodiment of the invention.

Referring to FIG. 2D, a chip 214 is flip-chip mounted on the structure 206, and is thereby electrically connected to its inner electrical circuits. For this purpose, the conductive traces 208 typically form a plurality of bump pads 208a on a top surface 206a of the structure 206. As conventionally performed, die pads 216 on an active surface 214a of the chip 214 are respectively attached to the bump pads 208a via a plurality of bumps 218. Instead of flip-chip mounting, the chip 214 alternatively may be electrically connected via bonding wires as illustrated in FIG. 5 and described hereafter.

Figure 2E:
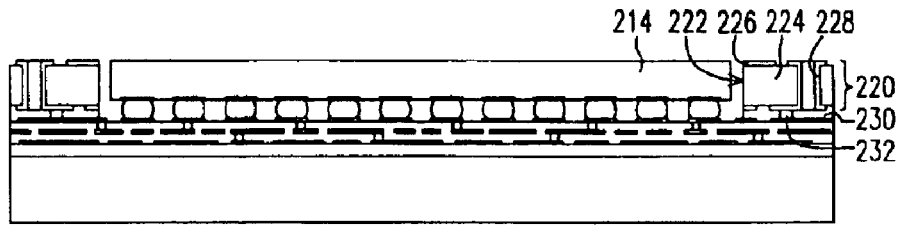

Referring to FIG. 2E, a stiffener substrate 220 is further attached on the structure 206 to reinforce the mechanical strength and establish further electrical connections. The attachment of the stiffener substrate 220 may be achieved through, for example, an adhesive layer 230 formed on the top surface 206a of the structure 206. For economical cost consideration, the stiffener substrate 220 is, for example, an organic chip carrier substrate that could be a two-layered substrate and be incorporated passive components either on its surface or embedded inside. The stiffener substrate 220 includes at least one hole 222, for example formed by punching, in which is received the chip 214.

In the illustrated embodiment of FIG. 2E, the stiffener substrate 220, for example, includes an insulating core 224, two conductive layers 226 formed on two opposite surfaces of the core 224, and a plurality of plated through holes (PTH) 228 electrically connecting the conductive layers 226 through the core 224. The adhesive layer 230 further internally includes a plurality of conductive vias 232 that electrically connect the conductive layers 226 of the stiffener substrate 220 to the conductive traces 208 of the structure 206. Therefore, the inner routing space is increased. The conductive vias 232 may be constituted by, for example, forming openings through the adhesive layer 230 and filling these openings with a conductive paste. Furthermore, the stiffener substrate 220 could include at least one passive component arranged inside the substrate 220 or on the surface of the substrate 220.

Figure 2F:
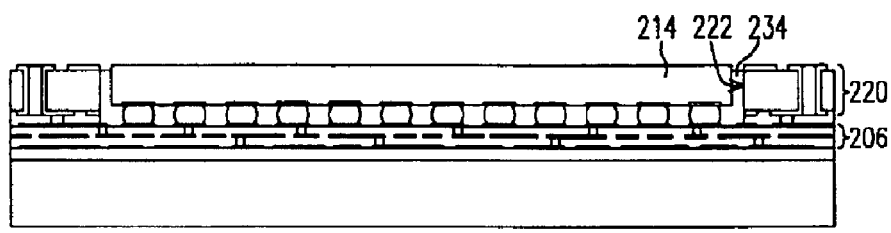

Referring to FIG. 2F, a sealing compound 234 is filled between the chip 214 and the structure 206, and in the gap between the chip 214 and the sidewall of the hole 222 to prevent the presence of gaseous voids that may undesirably produce a "popcorn" effect. It should be noticed that the portion of sealing compound 234 between the chip 214 and the structure 206 may be previously formed at the step illustrated in FIG. 2D by underfill to share thermal strains.

Figure 2G:
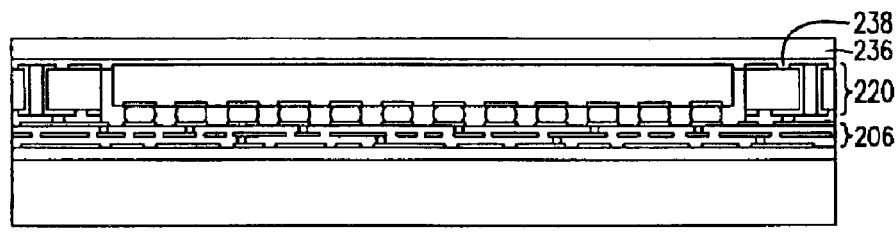

Referring to FIG. 2G, a heat sink 236 may be further attached on the chip 214 and the stiffener substrate 220. The heat sink 236 is made of, for example, copper, aluminum, or other adequate metallic alloys, and is attached via an adhesive layer 238. The heat sink 236 with the stiffener substrate 220 further reinforce the mechanical strength of the entire structure, and promote heat dissipation by convection through its surface to external environment.

Figure 2H:
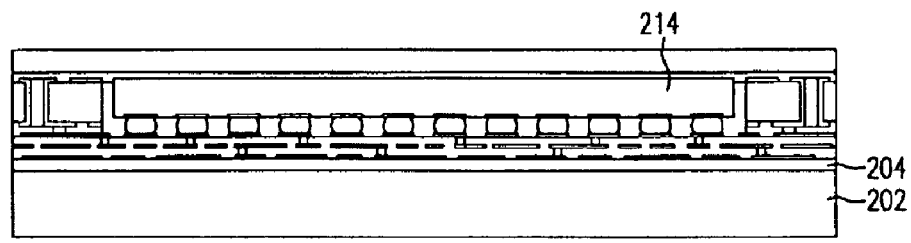
Figure 2I:
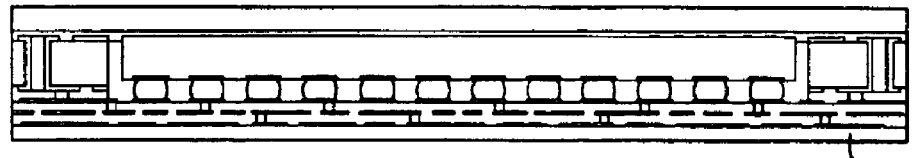

Next referring to FIG. 2H and FIG. 2I, the base substrate 202 is removed to expose the isolating layer 204. To facilitate this operation, a light may be radiated through the base substrate 202 to the isolating layer 204 to reduce the adhesion between both layers. The radiated light may be an ultra-violet light or a laser beam. Alternatively, heating may be used to reduce the adhesion between both layers 202, 204. To prevent the damage of the electrical circuitry (including that of the chip 214) located over the isolating layer 204 due to light irradiation, the isolating layer may be made of a composite structure, for example including a light barrier layer sandwiched between two dielectric layers (not shown). The light barrier layer stops the radiated light, which therefore prevents its reaching and damaging the electrical circuitry above the isolating layer 204. Once having been removed, the base substrate 202 may be economically reused.

Figure 2J:
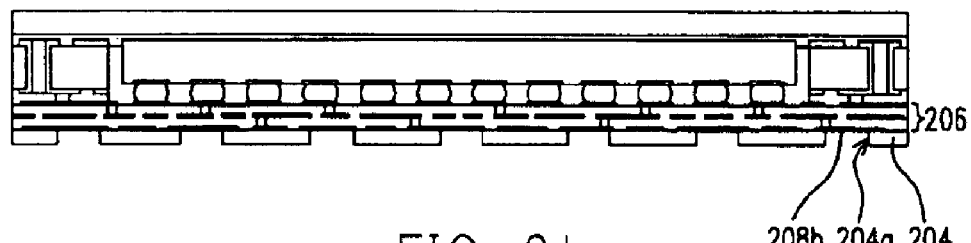

Next referring to FIG. 2J, a plurality of openings 204a are formed through the isolating layer 204 to respectively expose a plurality of contact pads 208b defined from the conductive layer 208 of the structure 206. A photo via process, plasma etching or laser ablation may be adequate to form the openings 204a.

Figure 2K:
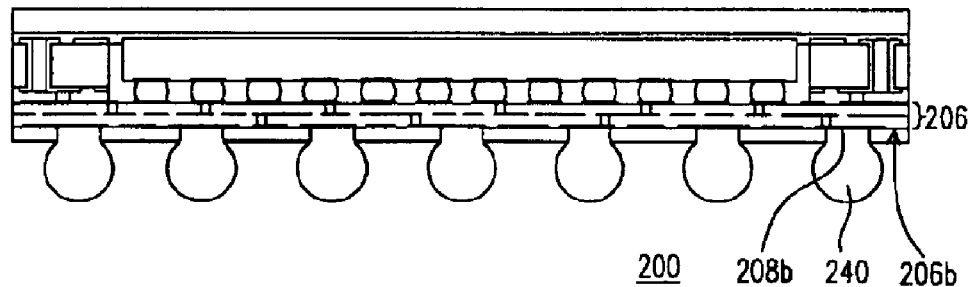

Next referring to FIG. 2K, a plurality of external connection members 240 are respectively formed on the contact pads 208b. The connection members 240 may be, for example, solder balls or connection pins. Thereafter, a singulation process is performed to obtain an individual chip package 200. Alternatively, the singulation process may be performed before the connection members 240 are formed at the stage shown in FIG. 2J.

The connection members 240 are preferably distributed in grid array on the bottom surface 206b of the structure 206, so that the formed chip package is either a ball grid array or pin grid array package depending on whether the connection members 240 are solder balls or connection pins.

As described above, the chip packaging process of the invention therefore economically uses a stiffener substrate that, associated with a heat sink, reinforce the mechanical strength of the package structure and further promote heat dissipation through the heat sink. Alternatively, a single heat sink provided with a cavity may be substituted for the above association of a stiffener substrate and a heat sink as described in the following second embodiment of the invention.

Reference now is made to FIG. 3A through FIG. 3D to describe a chip packaging process according to a second embodiment of the invention. It should be noticed that only the processing steps particular to this second embodiment are illustrated, and the description of the processing steps common to the first and second embodiments are omitted.

Figure 3A:
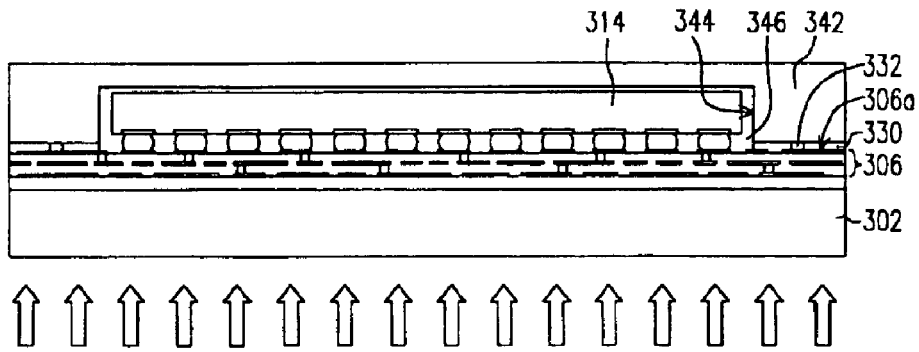
FIG. 3A through FIG. 3D are schematic views of a chip packaging process according to the second embodiment of the invention.

As illustrated in FIG. 3A, an isolating layer 304 and a multi-layered interconnection structure 306 are sequentially formed on a base substrate 302, and a chip 314 is flip-chip mounted on the top surface 306a of the structure 306, similar to the first embodiment. A heat sink 342, having a cavity 344, is attached on the top surface 306a via an adhesive layer 330, with the cavity 344 facing down to receive the chip 314 therein. The heat sink 342 is preferably made of a material having good thermal conduction such as copper or aluminum. The adhesive layer 330 includes a plurality of conductive vias 332 that connect the conductive traces inside the structure 306 to the heat sink 342. If the heat sink 342 is electrically conductive, a power reference or ground reference can be thereby provided.

A sealing compound 346 is filled in the gaps between the chip 314 and the structure 306 and the gaps between the chip 314 and the inner sides of the cavity 344 to prevent a popcorn effect.

Figure 3B:
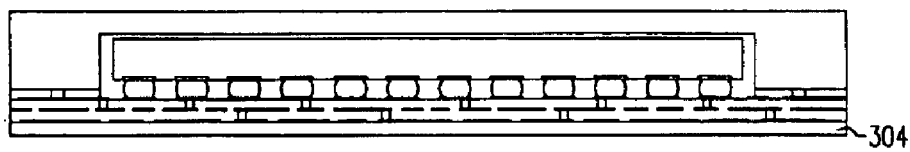
Figure 3C:
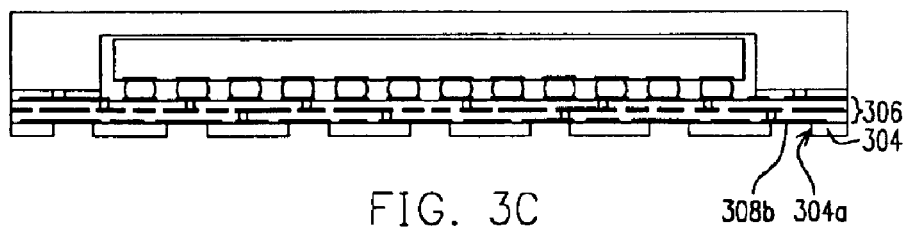

Referring to FIG. 3B and FIG. 3C, the base substrate 302 then is removed to expose the isolating layer 304 according to a manner similar to the first embodiment. Openings 304a then are formed through the isolating layer 304 to expose contact pads 308b on the bottom surface 306b of the structure 306, on which external connection members 340 are formed.

Figure 3D:
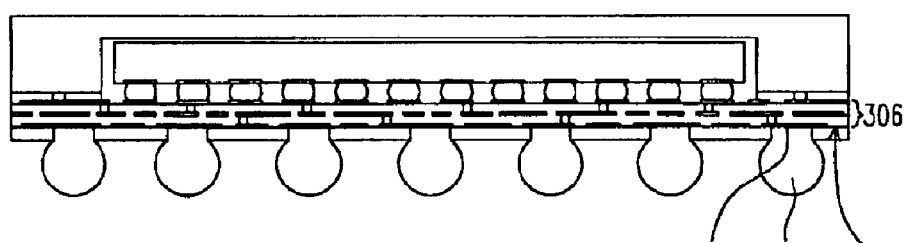

Referring to FIG. 3D, connection members 340 are subsequently attached to the contact pads 308b, similar to the previous embodiment.

The above embodiments describe a packaging structure that principally comprises a single chip. However, more than one chip may be also similarly included in the packaging structure as described below.

Figure 4:
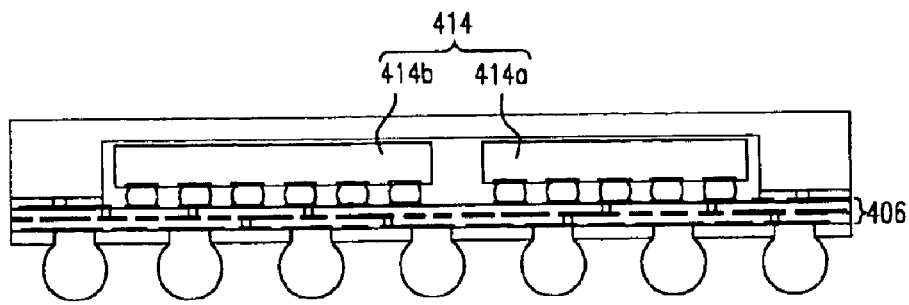
FIG. 4 is a schematic view of a chip packaging structure according to the third embodiment of the invention.

Referring to FIG. 4, a schematic view illustrates a packaging structure according to a third embodiment of the invention. As illustrated, a chip module 414 is packaged in the packaging structure. The chip module 414 includes a plurality of chips 414a, 414b that are flip chip mounted on the multi-layered interconnection structure 406 and electrically connected through its inner circuit. The chips 414a, 414b are thereby interconnected through the inner circuits of the multi-layered interconnection structure 406, and can therefore form a multi-chip module (MCM) or a system in package (SIP).

As illustrated in FIG. 5, the chips 514a, 514b of the chip module alternatively may be attached on the multi-layered interconnection structure 506 in a manner to be electrically connected to its inner circuits through bonding wires 519.

Figure 6:
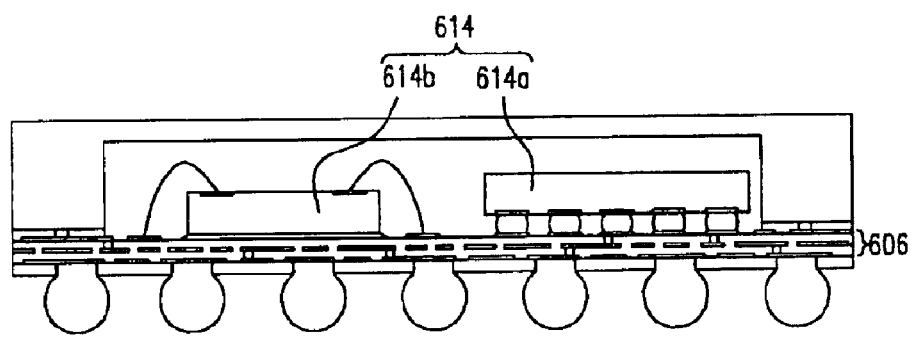
FIG. 6 is a schematic view of a chip packaging structure according to the fifth embodiment of the invention.

As illustrated in FIG. 6, the chip module 614 alternatively may include a chip 614a that is flip chip connected on the multi-layered interconnection structure 606, and a chip 614b that is connected on the multi-layered interconnection structure 606 via wire bonding.

As described above, the invention therefore provides a chip packaging process that favorably implements processing techniques usually dedicated to the fabrication of TFT-LCD panels or integrated circuits. Implemented in the invention, these processing techniques allow the fabrication of a multi-layered interconnection structure with a high density of bump pads and a finer inner circuit layout (trace pitch and trace width about and even smaller than 1 $\mu$m). Therefore, the specific multilayered interconnection structure used in the invention can advantageously accommodate one or more chips having a high density of bonding pads, and further allows an easier control of the electrical impedance of the conductive traces. The chips may be electrically connected either via flip chip mount or wire bonding.

Furthermore, the base substrate can have a larger surface area, typically larger than 610 mm×610 mm. More chip packages can be therefore fabricated from a single base substrate, which decreases the fabrication cost.

It should be apparent to those skilled in the art that other structures that are obtained from various modifications and variations of different parts of the above-described structures of the invention would be possible without departing from the scope and spirit of the invention as illustrated herein. Therefore, the above description of embodiments and examples only illustrates specific ways of making and performing the invention that, consequently, should cover variations and modifications thereof, provided they fall within the inventive concepts as defined in the following claims.

What is claimed is:

1. A chip packaging process, comprising:
   (a) providing a base substrate;
   (b) forming an isolating layer on the base substrate;
   (c) forming a multi-layered interconnection structure on the isolating layer, wherein the multi-layered interconnection structure includes inner electrical circuits that are electrically connected to a plurality of contact pads formed on a bottom surface of the multi-layered interconnection structure;
   (d) mounting at least one chip on the top surface of the multi-layered interconnection structure, the chip being electrically connected to the inner electrical circuits;

(e) attaching a heat sink on the top surface of the multi-layered interconnection structure, wherein the heat sink having at least one cavity that receives the chip therein;

(f) removing the base substrate; and (g) forming a plurality of openings through the isolating layer to respectively expose the contact pads.

2. The process of claim 1, wherein the chip is mounted on the multi-layered interconnection structure by a flip-chip type in step (d).

3. The process of claim 1, wherein the chip is mounted on the multi-layered interconnection structure by a wire-bonding type in step (d).

4. The process of claim 1, wherein the base substrate is selected from one of the glass, quartz and ceramics.

5. The process of claim 1, wherein at step (b), further comprising arranging at least one passive component inside the multi-layered interconnection structure.

6. The process of claim 1, wherein step (f) is performed by radiating a light through the base substrate to the isolating layer to reduce the adhesion between the base substrate and the isolating layer, and subsequently removing the base substrate.

7. The process of claim 1, wherein step (f) is performed by heating and transferring the heat through the base substrate to reduce the adhesion between the base substrate and the isolating layer, and subsequently removing the base substrate.

8. A chip packaging process, comprising:

(a) providing a base substrate;

(b) forming an isolating layer on the base substrate;

(c) forming a multi-layered interconnection structure on the isolating layer, wherein the multi-layered interconnection structure includes inner electrical circuits that are electrically connected to a plurality of contact pads formed on a bottom surface of the multi-layered interconnection structure;

(d) mounting at least one chip on the top surface of the multi-layered interconnection structure, the chip being electrically connected to the inner electrical circuits;

(e) attaching a stiffener substrate on the top surface of the multi-layered interconnection structure, wherein the stiffener substrate having at least one hole that receives the chip therein;

(f) removing the base substrate; and (g) forming a plurality of openings through the isolating layer to respectively expose the contact pads.

9. The process of claim 8, wherein the chip is mounted on the multi-layered interconnection structure by a flip-chip type in step (d).

10. The process of claim 8, wherein the chip is mounted on the multi-layered interconnection structure by a wire-bonding type in step (d).

11. The process of claim 8, wherein the base substrate is selected from one of the glass, quartz and ceramics.

12. The process of claim 8, wherein at step (b), further comprising arranging at least one passive component inside the multi-layered interconnection structure.

13. The process of claim 8, wherein after step (e), further comprising attaching a heat sink on the stiffener substrate.

14. The process of claim 8, wherein the stiffener substrate includes conductive traces that are electrically connected to the inner electrical circuits of the multi-layered interconnection structure.

15. The process of claim 8, wherein the stiffener substrate further comprises at least one passive component.

16. The process of claim 8, wherein step (f) is performed by radiating a light through the base substrate to the isolating layer to reduce the adhesion between the base substrate and the isolating layer, and subsequently removing the base substrate.

17. The process of claim 8, wherein step (f) is performed by heating and transferring the heat through the base substrate to reduce the adhesion between the base substrate and the isolating layer, and subsequently removing the base substrate.

* * * * *